(12) United States Patent
Saito et al.

(10) Patent No.: US 11,293,950 B2
(45) Date of Patent: Apr. 5, 2022

(54) CURRENT SENSOR HAVING SOFT MAGNETIC BODIES FOR ADJUSTING MAGNETIC FIELD INTENSITY

(71) Applicant: TDK Corporation, Tokyo (JP)

(72) Inventors: Yuta Saito, Tokyo (JP); Kenichi Takano, Tokyo (JP); Hiraku Hirabayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 165 days.

(21) Appl. No.: 15/997,986

(22) Filed: Jun. 5, 2018

(65) Prior Publication Data

US 2018/0356448 A1 Dec. 13, 2018

(30) Foreign Application Priority Data

Jun. 13, 2017 (JP) .............................. JP2017-116113

(51) Int. Cl.
*G01R 15/20* (2006.01)
*G01R 33/09* (2006.01)
*G01R 19/00* (2006.01)

(52) U.S. Cl.
CPC ....... *G01R 15/205* (2013.01); *G01R 19/0092* (2013.01); *G01R 33/093* (2013.01)

(58) Field of Classification Search
None
See application file for complete search history.

(56) References Cited

U.S. PATENT DOCUMENTS

| | | | | |
|---|---|---|---|---|
| 2012/0062215 | A1* | 3/2012 | Ide | B82Y 25/00 324/202 |
| 2012/0062224 | A1* | 3/2012 | Ide | B82Y 25/00 324/252 |
| 2017/0082659 | A1* | 3/2017 | Harada | G01R 15/20 |
| 2018/0196088 | A1 | 7/2018 | Ichinohe et al. | |

FOREIGN PATENT DOCUMENTS

| | | |
|---|---|---|
| JP | 2015-219227 A | 12/2015 |
| JP | 2016-001168 A | 1/2016 |
| WO | 2010/143666 A1 | 12/2010 |
| WO | 2010/143718 A1 | 12/2010 |
| WO | 2017/064921 A1 | 4/2017 |

* cited by examiner

*Primary Examiner* — Douglas X Rodriguez
(74) *Attorney, Agent, or Firm* — Posz Law Group, PLC

(57) ABSTRACT

A current sensor has: a magneto-resistive effect element which is arranged near a current line, to which a signal magnetic field is applied, the signal magnetic field being is induced by a current that flows in the current line, and which generates a magneto-resistive change in accordance with a change of the signal magnetic field; cancelling magnetic field generating means that is provided near the magneto-resistive effect element and that generates a cancelling magnetic field that cancels the signal magnetic field; a first soft magnetic body that is provided between the magneto-resistive effect element and the current line; and a pair of second soft magnetic bodies that are provided on both sides of the magneto-resistive effect element with regard to a magnetization detecting direction of the magneto-resistive effect element.

9 Claims, 9 Drawing Sheets

Embodiment 1

Comp. Example 2

Embodiment 2

Comp. Example 3

Comp. Example 1

Comp. Example 4

CURRENT SENSOR HAVING SOFT MAGNETIC BODIES FOR ADJUSTING MAGNETIC FIELD INTENSITY

BACKGROUND OF THE INVENTION

Field of the Invention

The present application is based on, and claims priority from, JP Application No. 2017-116113, filed on Jun. 13, 2017, the disclosure of which is hereby incorporated by reference herein in its entirety.

The present invention relates to a current sensor, and particularly to a magnetic balance type current sensor.

Description of the Related Art

A magnetic balance type current sensor having a magneto-resistive effect element and a feedback coil detects a current that flows in a current line by sensing a magnetic field that is generated by the current that flows in the current line. Specifically, when a signal magnetic field is applied to a magneto-resistive effect element, the magneto-resistive effect element outputs a voltage signal that corresponds to the signal magnetic field. The voltage signal is inputted into the feedback coil, and the feedback coil generates a cancelling magnetic field that cancels the signal magnetic field. A feedback current that flows in the feedback coil is converted to a voltage and taken out.

In such a magnetic balance type current sensor, a feedback current continuously flows when a signal magnetic field is applied. Therefore, it is important to reduce power consumption. WO2010/143718 discloses a magnetic balance type current sensor in which a magnetic shield is provided between a magneto-resistive effect element and a current line. The magnetic shield absorbs the magnetic field that is generated by the current line and attenuates the signal magnetic field that is applied to the magneto-resistive effect element. Further, the magnetic shield intensifies the cancelling magnetic field. Due to these effects, the feedback current can be reduced and power consumption can be limited.

WO2010/143666 discloses a magnetic balance type current sensor in which magnetic cores are provided on both sides of a magneto-resistive effect element with regard to the magnetization detecting direction of the element. A feedback coil is wound around the magnetic cores. The magnetic cores intensify not only a cancelling magnetic field that is generated by the feedback coil but also a signal magnetic field that is applied to the magneto-resistive effect element. It is thus possible to enhance the sensitivity of the magnetic balance type current sensor.

SUMMARY OF THE INVENTION

In the current sensor disclosed in WO2010/143718, the effect of attenuating the signal magnetic field that is applied to the magneto-resistive effect element is larger than the effect of intensifying the cancelling magnetic field. For this reason, although power consumption is limited, accuracy with which a current is detected significantly deteriorates due to the decreased sensitivity of the magneto-resistive effect element. In the current sensor disclosed in WO2010/143666, the amplification factor of the signal magnetic field that is applied to the magneto-resistive effect element is larger than the amplification factor of the cancelling magnetic field. Thus, although the sensitivity of the current sensor is improved, power consumption is significantly increased due to an increase of the feedback current.

It is an object of the present invention to provide a current sensor having a high current detection accuracy and a limited power consumption.

A current sensor of the present invention comprises: a magneto-resistive effect element which is arranged near a current line, to which a signal magnetic field (first magnetic field) is applied, the signal magnetic field being induced by a current that flows in the current line, and which generates a magneto-resistive change in accordance with a change of the signal magnetic field; cancelling magnetic field generating means (second magnetic field generating means) that is provided near the magneto-resistive effect element and that generates a cancelling magnetic field (second magnetic field) that cancels the signal magnetic field; a first soft magnetic body that is provided between the magneto-resistive effect element and the current line; and a pair of second soft magnetic bodies that are provided on both sides of the magneto-resistive effect element with regard to a magnetization detecting direction of the magneto-resistive effect element.

According to the present invention, the first soft magnetic body reduces the signal magnetic field that is applied to the magneto-resistive effect element and increases the cancelling magnetic field that is applied to the magneto-resistive effect element. The second soft magnetic bodies increase the intensities of the signal magnetic field and the cancelling magnetic field that are applied to the magneto-resistive effect element. In other words, since the signal magnetic field that is attenuated by the first soft magnetic body is intensified by the second soft magnetic bodies, the signal magnetic field that is applied to the magneto-resistive effect element is prevented from being largely attenuated. The cancelling magnetic field is intensified by both the first soft magnetic body and the second soft magnetic bodies, and accordingly the feedback current is limited. In this manner, according to the present invention, it is possible to provide a current sensor having high current detection accuracy and limited power consumption.

DETAILED DESCRIPTION OF EMBODIMENTS

Below, a magnetic balance type current sensor (hereinafter referred to as a current sensor) according to various embodiments of the present invention will be described with reference to the drawings. In the following description and drawings, the x-direction is a direction in which a signal magnetic field and a cancelling magnetic field are applied, and corresponds to a magnetization detecting direction of the current sensor. The y-direction is a direction in which a current to be detected flows or a direction in which a current line extends. The z-direction is a direction that is perpendicular to the x-direction and the y-direction and that is parallel to the stacking direction of the magneto-resistive effect element. "External magnetic field Bo" means a magnetic field that is induced by a current that flows in the current line, and "signal magnetic field (first magnetic field) Bs" means a magnetic field that is applied to the magneto-resistive effect element. In other words, "signal magnetic field Bs" is "external magnetic field Bo" that is induced by the current that flows in the current line, then amplified or attenuated by the first and second soft magnetic bodies, described below, and then applied to the magneto-resistive effect element.

Figure 1:
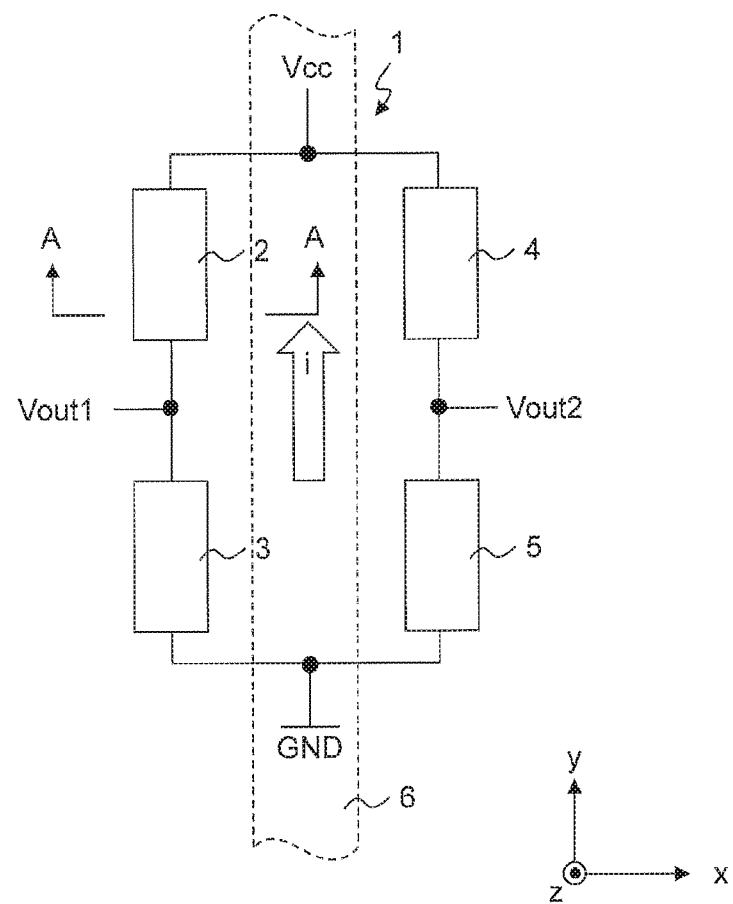
FIG. 1 is a circuit diagram showing a schematic configuration of a current sensor.

FIG. 1 shows a schematic configuration of current sensor 1. Current sensor 1 has four element arrays 2 to 5. Element arrays 2 to 5 are connected to each other in a bridge circuit (a Wheatstone bridge). Four element arrays 2 to 5 are separated into two sets 2, 3 and 4, 5. Element arrays 2, 3 and element arrays 4, 5 are connected in series, respectively. One end of each set of the element arrays is connected to power supply voltage Vcc, and the other end thereof is grounded (GND). Current sensor 1 outputs the intensity of signal magnetic field Bs by detecting the difference between middle point voltages Vout1 and Vout2 of respective sets 2, 3 and 4, 5 of the element arrays. It should be noted that signal magnetic field Bs can also be detected by using middle point voltage Vout1 or Vout 2 alone.

Figure 2A:
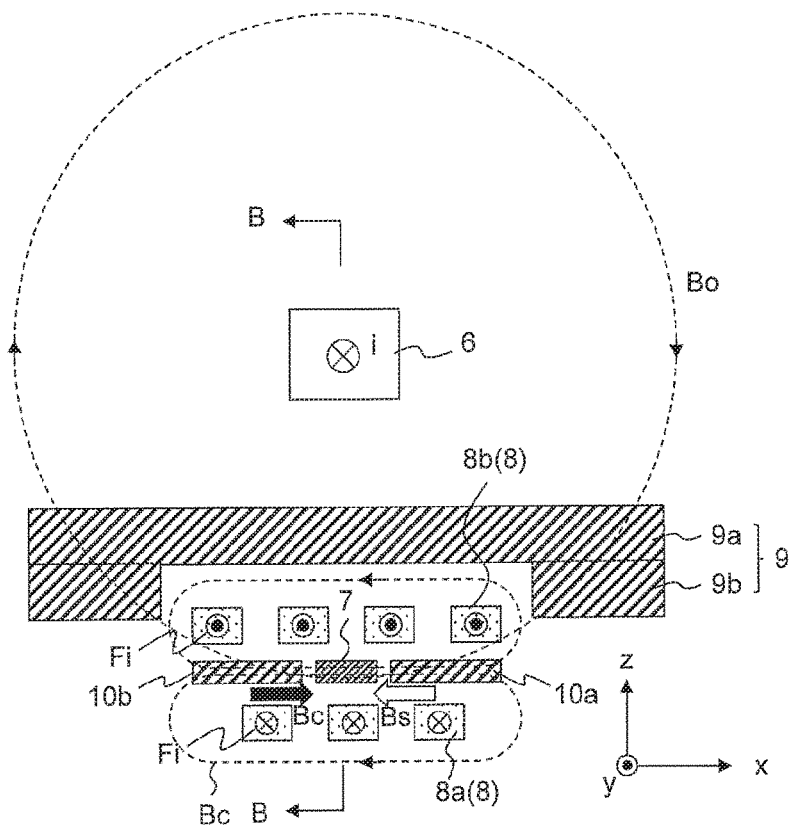
FIGS. 2A and 2B are views showing a schematic configuration of a current sensor according to a first embodiment.
Figure 2B:
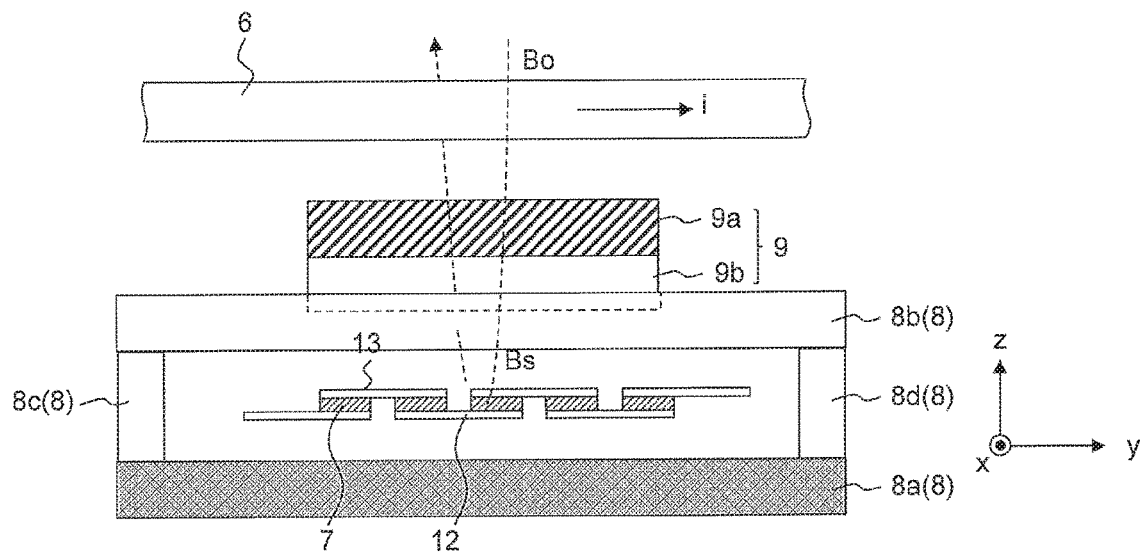
Figure 3:
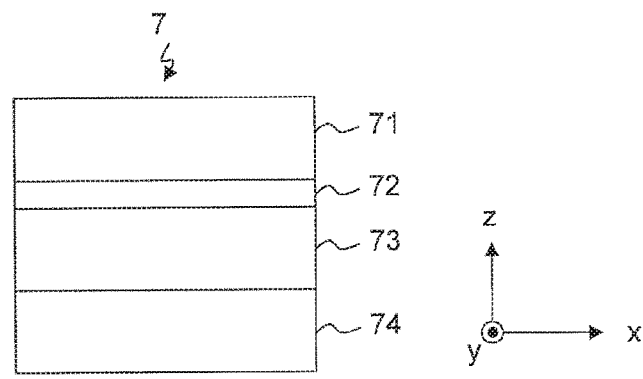
FIG. 3 is a sectional view showing a schematic configuration of a magneto-resistive effect element.
Figure 4:
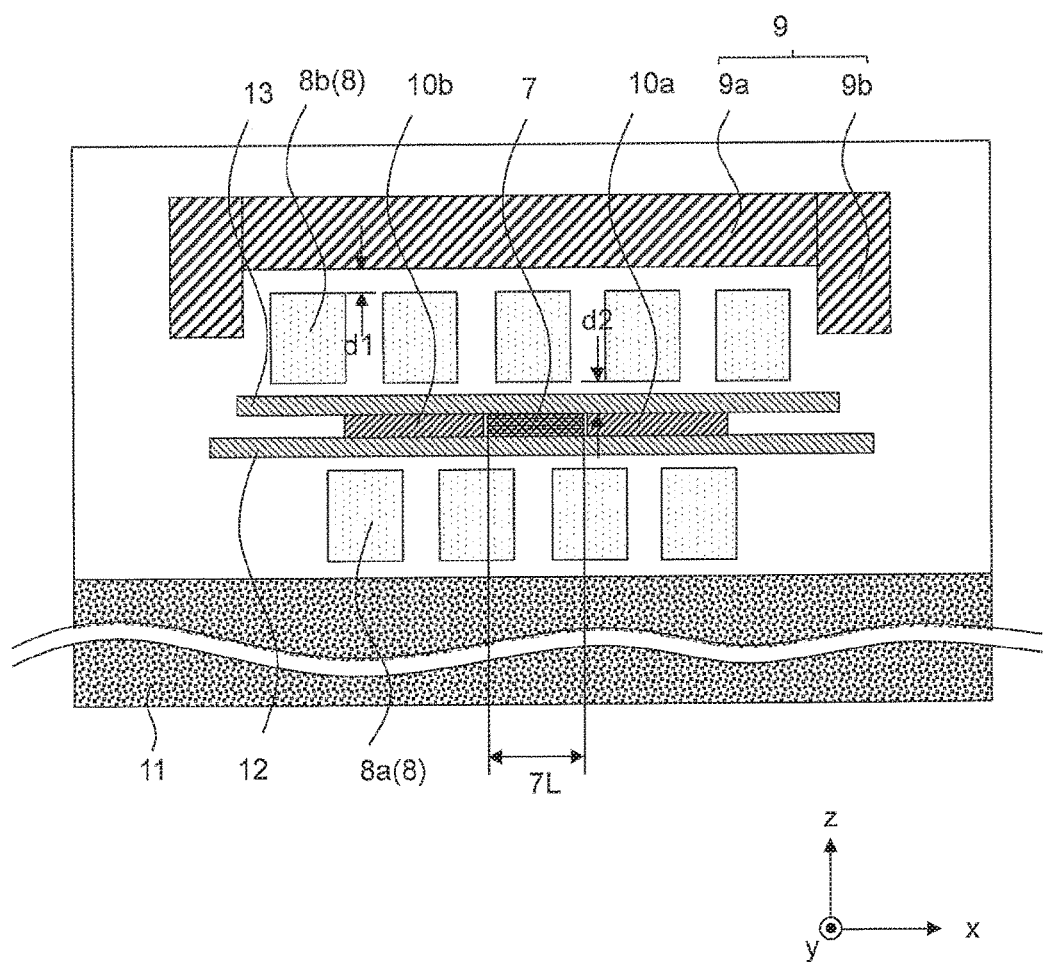
FIG. 4 is a sectional view showing the configuration of the current sensor of FIGS. 2A and 2B in more detail.

FIG. 2A is a schematic sectional view of current sensor 1 taken along line A-A in FIG. 1. For convenience, current line 6 is shown immediately above the magneto-resistive effect element in the z-direction, but the positional relationship between current sensor 1 and current line 6 is not limited as long as the x-direction component, or the component of the magnetization detecting direction of current sensor 1, of a magnetic field, is applied to current sensor 1. FIG. 2B is a sectional view taken along line B-B in FIG. 2A. The configuration of current line 6 is not limited, but current line 6 may be, for example, a busbar that is made of a conductor. Current sensor 1 includes a plurality of magneto-resistive effect elements 7 that are connected in series. Magneto-resistive effect elements 7 are arranged near current line 6 and generate a magneto-resistive (MR) change in accordance with a change in signal magnetic field Bs that is applied. FIG. 3 shows a schematic sectional view of magneto-resistive effect element 7. Magneto-resistive effect element 7 has a film configuration of a typical spin valve. Specifically, magneto-resistive effect element 7 has free layer 71 whose magnetization direction changes in accordance with signal magnetic field Bs, pinned layer 73 whose magnetization direction is fixed with respect to signal magnetic field Bs, spacer layer 72 that is positioned between free layer 71 and pinned layer 73 and that is in contact both with free layer 71 and with pinned layer 73 and antiferromagnetic layer 74 that is in contact with pinned layer 73 on the back side thereof, as seen from spacer layer 72. Antiferromagnetic layer 74 fixes the magnetization direction of pinned layer 73 by exchange coupling with pinned layer 73. Pinned layer 73 may also have a synthetic configuration having two ferromagnetic layers and a nonmagnetic intermediate layer that is interposed therebetween. When spacer layer 72 is a nonmagnetic and electrically conductive layer, magneto-resistive effect element 7 functions as a giant magneto-resistive (GMR) element, and when spacer layer 72 is a tunnel barrier layer, magneto-resistive effect element 7 functions as a TMR element. Because of a large MR change rate and a resultant large output voltage of the bridge circuit, magneto-resistive effect element 7 is more preferably configured by a TMR element. Length 7L (see. FIG. 4) of the TMR element in the magnetization detecting direction (x-direction) is preferably equal to or more than 0.1 μm and equal to or less than 10 μm, and the length of the TMR element in the direction that is parallel to current line 6, i.e., the length in the y-direction that is perpendicular to the magnetization detecting direction, is preferably twice as large as the length of the TMR element in the magnetization detecting direction or more.

Current sensor 1 includes solenoid feedback coil 8 that is provided near magneto-resistive effect element 7. Feedback coil 8 generates cancelling magnetic field (second magnetic field) Bc that cancels signal magnetic field Bs. Feedback coil 8 is spirally wound around magneto-resistive effect element 7 and second soft magnetic bodies 10a, 10b, described later. One turn of feedback coil 8 consists of lower portion 8a, upper portion 8b and a pair of lateral portions 8c, 8d that connect lower portion 8a to upper portion 8b. Solenoid feedback coil 8 is an example of cancelling magnetic field generating means (second magnetic field generating means). Feedback coil 8 may be formed, for example, of Cu. Feedback coil 8 is a single continuous coil, but two coils may be spirally wound around second soft magnetic body 10a and second soft magnetic body 10b, respectively. In other words, feedback coil 8 does not need to be wound around magneto-resistive effect element 7, and may be wound at least around second soft magnetic bodies 10a, 10b.

Current sensor 1 includes first soft magnetic body 9, which is first magnetic field intensity adjusting means, and a pair of second soft magnetic bodies 10a, 10b, which are second magnetic field intensity adjusting means. First soft magnetic body 9 and second soft magnetic bodies 10a, 10b are formed of a soft magnetic material, such as perm-alloy (Ni—Fe). First soft magnetic body 9 is provided between magneto-resistive effect element 7 and current line 6. First soft magnetic body 9 consists of first portion 9a and second portions 9b. First portion 9a expands parallel to substrate 11, described later, and covers magneto-resistive effect element 7 in order to shield magneto-resistive effect element 7 from current line 6. Second portions 9b extend from at least one edge, preferably both edges, of first portion 9a with regard to the magnetization detecting direction (the x-direction) in a direction toward substrate 11 (z-direction) that is perpendicular to the magnetization detecting direction (x-direction). The cross-sectional shapes of second portions 9b are rectangles that are connected to the end surfaces of first portion 9a in FIG. 4, but they may be rectangles having cut-outs at both ends of first portion 9a that face second soft magnetic bodies 10a, 10b, as shown in FIGS. 5A and 9A-9C. Second portions 9b may also be omitted. Second soft magnetic bodies 10a, 10b are provided on both sides of magneto-resistive effect element 7 with regard to the magnetization detecting direction of magneto-resistive effect element 7 (the x-direction).

FIG. 4 shows a cross section of current sensor 1 in more detail. Feedback coil 8 is provided above substrate 11 via an insulating layer. Magneto-resistive effect element 7 described above is formed inward of feedback coil 8. On both sides of magneto-resistive effect element 7 with regard to the x-direction, a pair of second soft magnetic bodies 10a, 10b is provided via an insulating layer, not shown. Magneto-resistive effect element 7 and a pair of second soft magnetic bodies 10a, 10b are formed on same x-y plane. Lower lead layer 12 is connected to the lower end of magneto-resistive effect element 7, and upper lead layer 13 is connected to the upper end of magneto-resistive effect element 7. Lower lead layer 12 and upper lead layer 13 function as electrodes that supply sense current to magneto-resistive effect element 7. Upper portion 8b of feedback coil 8 is covered with an insulating layer, above which first soft magnetic body 9 is provided. By providing a sufficient distance d1 between feedback coil 8 and first soft magnetic body 9, the influence on the sensitivity of magneto-resistive effect element 7 and the influence of hysteresis of first soft magnetic body 9 can be reduced. On the other hand, a too large distance d1 weakens the effect of shielding external magnetic field Bo by soft magnetic body 9, leading to an increase in power consumption. Accordingly, distance d1 is preferably equal to or more than 0.1 μm and equal to or less than 30 μm. When distance d2 between feedback coil 8 and each of second soft magnetic bodies 10a, 10b is small, cancelling magnetic field Bc is intensified. On the other hand, when distance d2 is too small, insulating resistance between magneto-resistive effect element 7 and feedback coil 8 is worsened. Therefore, distance d2 is preferably equal to or more than 0.1 μm and equal to or less than 10 μm.

Current sensor 1 described above operates as follows. Current i flows in current line 6 from front to back (the y-direction) in FIG. 2A and from left to right in FIG. 2B. Current i induces clockwise external magnetic field Bo in FIG. 2A. External magnetic field Bo is attenuated by first soft magnetic body 9, amplified by second soft magnetic bodies 10a, 10b, and applied leftward to magneto-resistive effect element 7 as signal magnetic field Bs. Magneto-resistive effect element 7 outputs a voltage signal that corresponds to signal magnetic field Bs, and the voltage signal is inputted into feedback coil 8. Feedback current Fi flows in feedback coil 8 and generates cancelling magnetic field Bc that cancels signal magnetic field Bs. Since signal magnetic field Bs and cancelling magnetic field Bc have the same absolute values and are applied in opposite directions, signal magnetic field Bs and cancelling magnetic field Bc cancel out, making the magnetic field that is applied to magneto-resistive effect element 7 substantially zero. Feedback current Fi is converted to a voltage by a resistance, not shown, and is output as a voltage value. Since the voltage value is proportional to feedback current Fi, cancelling magnetic field Bc and signal magnetic field Bs, the current that flows in current line 6 can be obtained from the voltage value.

First soft magnetic body 9 (first magnetic field intensity adjusting means) attenuates external magnetic field Bo. Therefore, signal magnetic field Bs that is applied to magneto-resistive effect element 7 is smaller than a signal magnetic field that would be obtained when first soft magnetic body 9 were not provided. Further, first soft magnetic body 9 (first magnetic field intensity adjusting means) increases cancelling magnetic field Bc that is applied to magneto-resistive effect element 7. On the other hand, second soft magnetic bodies 10a, 10b (second magnetic field intensity adjusting means) increase both signal magnetic field Bs and cancelling magnetic field Bc that are applied to magneto-resistive effect element 7 as compared to a case where second soft magnetic bodies 10a, 10b are not provided. Accordingly, external magnetic field Bo is first attenuated by first soft magnetic body 9, then amplified by second soft magnetic bodies 10a, 10b, and then applied to magneto-resistive effect element 7 as signal magnetic field Bs. Cancelling magnetic field Bc is amplified by both first soft magnetic body 9 and second soft magnetic bodies 10a, 10b. Moreover, since second soft magnetic bodies 10a, 10b are adjacent to the lateral sides of free layer 71 of magneto-resistive effect element 7 via insulating layers therebetween, magnetic flux is effectively added to free layer 71. This enhances the sensitivity of free layer 71 itself.

Figure 5A:
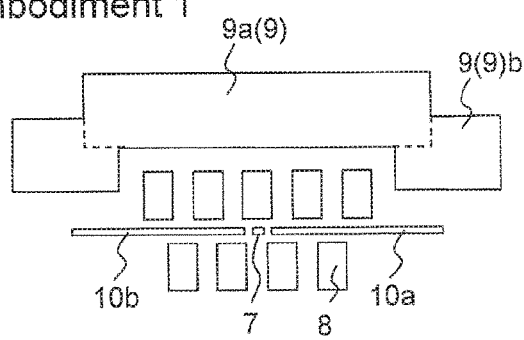
FIGS. 5A to 5F are schematic views of Embodiments and Comparative Examples of the current sensor.
Figure 5D:
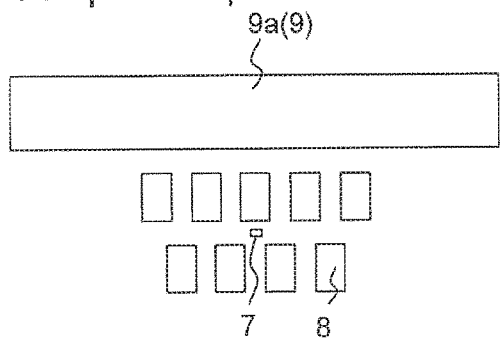
Figure 5B:
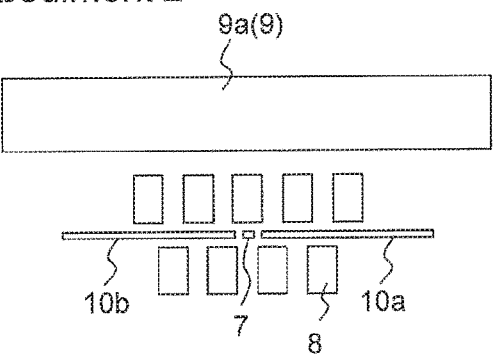
Figure 5E:
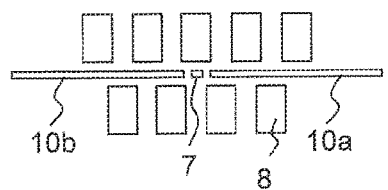
Figure 5C:
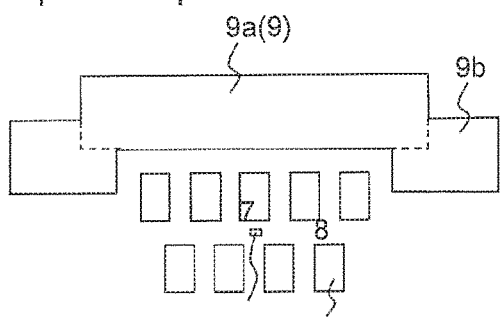
Figure 5F:
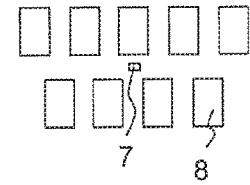

FIGS. 5A to 5F show schematic configurations of some Embodiments and Comparative Examples. The current sensor of Embodiment 1 shown in FIG. 5A corresponds to the embodiment described above and includes first soft magnetic body 9 and second soft magnetic bodies 10a, 10b. First soft magnetic body 9 includes first portion 9a and second portions 9b. The current sensor of Embodiment 2 shown in FIG. 5B is the same as the current sensor of Embodiment 1 except that first soft magnetic body 9 only has first portion 9a (second portions 9b are omitted). First portion 9a of the current sensor of Embodiment 2 has a plate-like shape that expands parallel to substrate 11. The current sensor of Comparative Example 1 shown in FIG. 5C includes first soft magnetic body 9 of Embodiment 1, but second soft magnetic bodies 10a, 10b are omitted. The current sensor of Comparative Example 2 shown in FIG. 5D includes first soft magnetic body 9 of Embodiment 2, but second soft magnetic bodies 10a, 10b are omitted. The current sensor of Comparative Example 3 shown in FIG. 5E includes second soft magnetic bodies 10a, 10b of Embodiments 1 to 2, but first soft magnetic body 9 is omitted. The current sensor of Comparative Example 4 shown in FIG. 5F includes neither first soft magnetic body 9 nor second soft magnetic bodies 10a, 10b.

Figure 6:
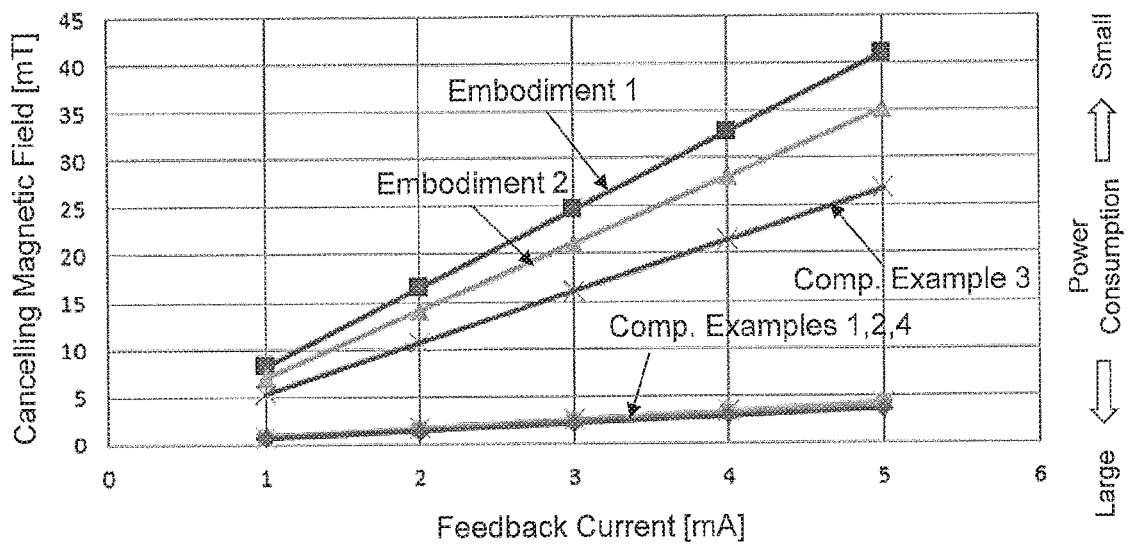
FIG. 6 is a graph showing a relationship between a feedback current and a cancelling magnetic field.

FIG. 6 shows a relationship between feedback current Fi and cancelling magnetic field Bc in Embodiments 1 to 2 and Comparative Examples 1 to 4. In Embodiments 1 to 2, desired cancelling magnetic field Bc can be obtained from small feedback current Fi, and especially in Embodiment 1, feedback current Fi is the smallest. This is because (1) both first soft magnetic body 9 and second soft magnetic bodies 10a, 10b function as yokes for intensifying the magnetic field that is generated by feedback coil 8, and (2) second portions 9b of first soft magnetic body 9 are disposed such that they surround magneto-resistive effect element 7, and for these reasons (1), (2), cancelling magnetic field Bc is further amplified. Therefore, Embodiments 1 to 2 are more advantageous than Comparative Examples 1 to 4 from the viewpoint of power consumption, and Example 1 is the most advantageous.

Figure 7:
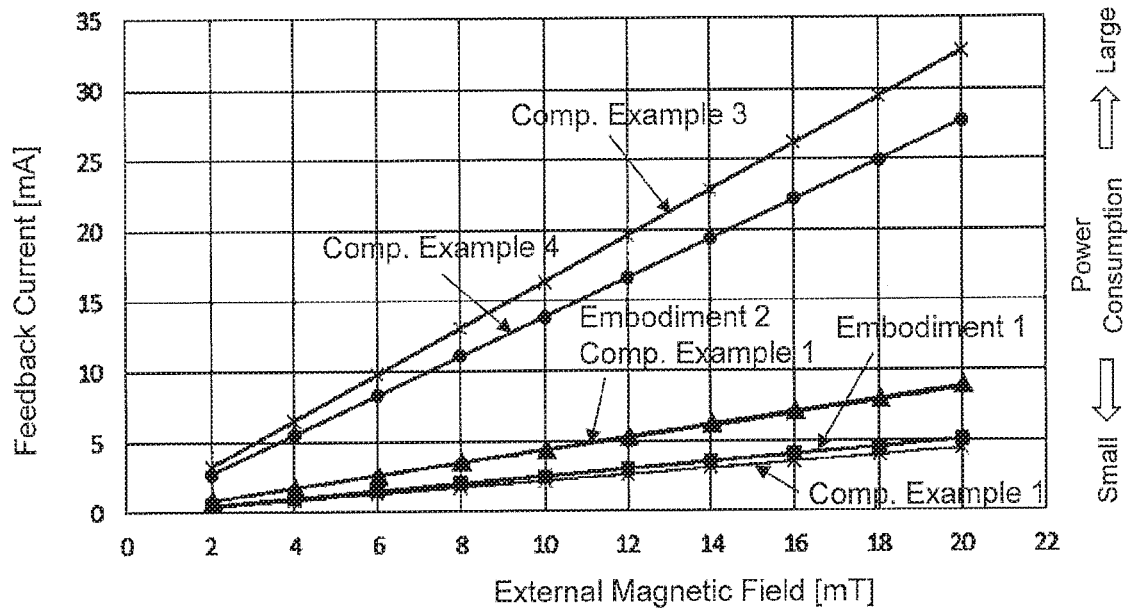
FIG. 7 is a graph showing a relationship between an external magnetic field and a feedback current.

FIG. 7 shows a relationship between external magnetic field Bo and feedback current Fi in Embodiments 1 to 2 and Comparative Examples 1 to 4. Embodiment 1 and Comparative Example 1 show the smallest feedback current Fi that is required to cancel external magnetic field Bo. On the other hand, in Comparative Examples 3 and 4 where first soft magnetic body 9 is not provided, large feedback current Fi is required to cancel external magnetic field Bo because external magnetic field Bo is not attenuated and large signal magnetic field Bs is applied to magneto-resistive effect element 7. In Embodiment 1, power consumption can be largely reduced because external magnetic field Bo is attenuated by first soft magnetic body 9. In Embodiment 2 and Comparative Example 1, feedback current Fi is larger than that in Embodiment 1 and Comparative Example 1 but smaller than that in Comparative Examples 3 and 4. Therefore, even when first soft magnetic body 9 only includes first portion 9a, it is possible to limit feedback current Fi and thereby to limit power consumption.

Figure 8:
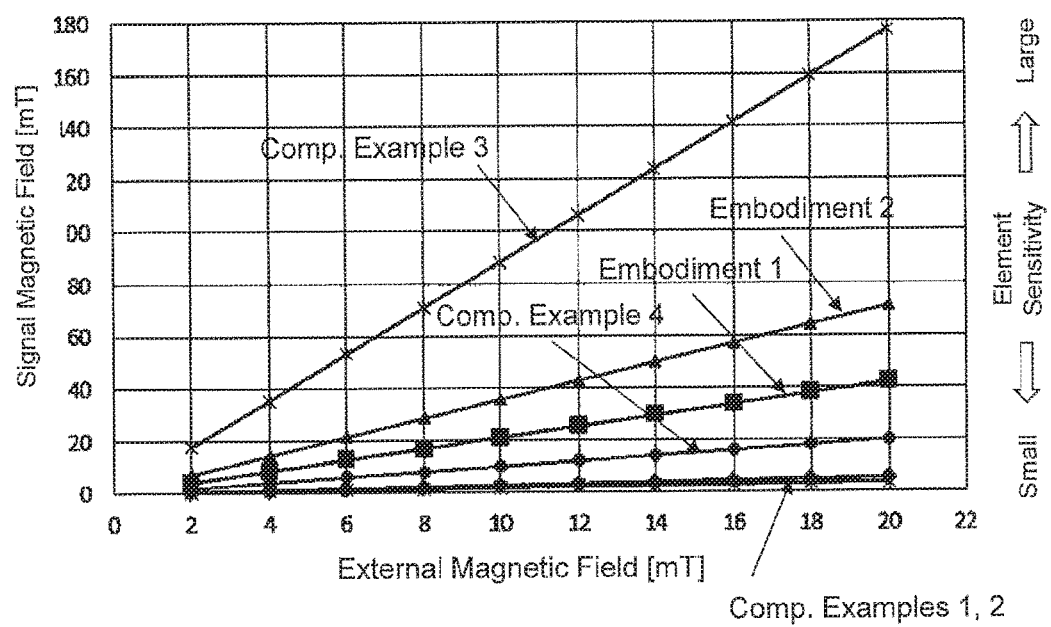
FIG. 8 is a graph showing a relationship between an external magnetic field and a signal magnetic field.

FIG. 8 shows a relationship between external magnetic field Bo and signal magnetic field Bs in Examples 1 to 2 and Comparative Examples 1 to 4. A ratio of signal magnetic field Bs to external magnetic field Bo is referred to as a signal magnetic field amplification ratio. The signal magnetic field amplification ratio is defined as a ratio of "signal magnetic field Bs that is actually applied to magneto-resistive effect element 7" to "signal magnetic field Bs that is applied to magneto-resistive effect element 7 when the first and second magnetic field intensity adjusting means (first soft magnetic body 9, second soft magnetic bodies 10a, 10b) are not provided". The signal magnetic field amplification ratio is equal to the gradient of the graph of FIG. 8, and the larger is the signal magnetic field amplification ratio, the higher is the sensitivity of magneto-resistive effect element 7 (hereinafter referred to as an element sensitivity). The higher the sensitivity of the element, the greater is the accuracy in detecting current. In Comparative Example 3, the largest signal magnetic field Bs is applied for the same external magnetic field Bo, and the element sensitivity is the highest among Comparative Examples 1-4. This is because Comparative Example 3 is not provided with first soft magnetic body 9 that attenuates external magnetic field Bo, but is provided with second soft magnetic bodies 10a, 10b that amplify external magnetic field Bo.

Out of four Comparative Examples, Comparative Examples 1 and 2, where first soft magnetic body 9 is provided but second soft magnetic bodies 10a, 10b are not provided, show the lowest element sensitivity, in contrast to Comparative Example 3, because external magnetic field Bo is attenuated at the largest rate. A decrease in element sensitivity makes temperature offset drift (a phenomenon in which a difference between outputs Vout 1 and Vout 2 of the current sensor is shifted depending on temperatures) relatively dominant, and further increases measurement errors. Embodiments 1 to 2 show higher element sensitivity than Comparative Examples 1, 2 and 4, although they are inferior to Comparative Example 3 in element sensitivity. It is found from the above comparison that, in Embodiments 1 to 2, power consumption is limited and the element sensitivity is favorable, and that these embodiments provide both limited power consumption and good current detection accuracy.

Figure 9A:
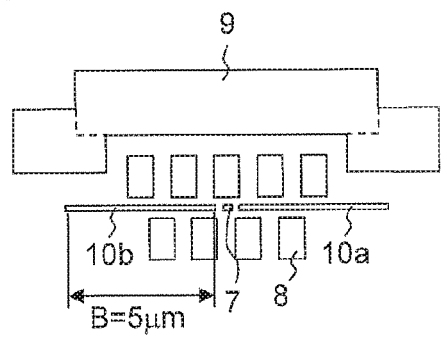
FIGS. 9A to 9C are views showing second soft magnetic bodies having various widths in the magnetization detecting direction.
Figure 9C:
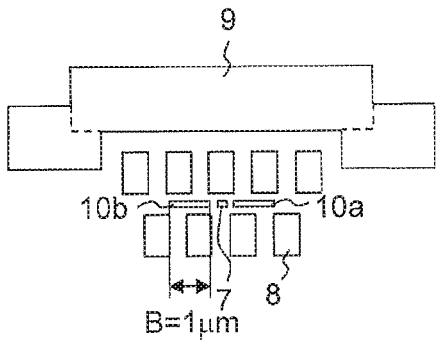
Figure 9B:
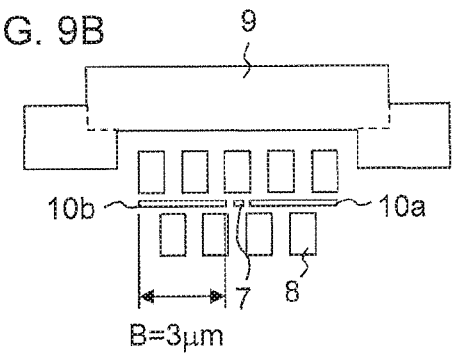
Figure 9D:
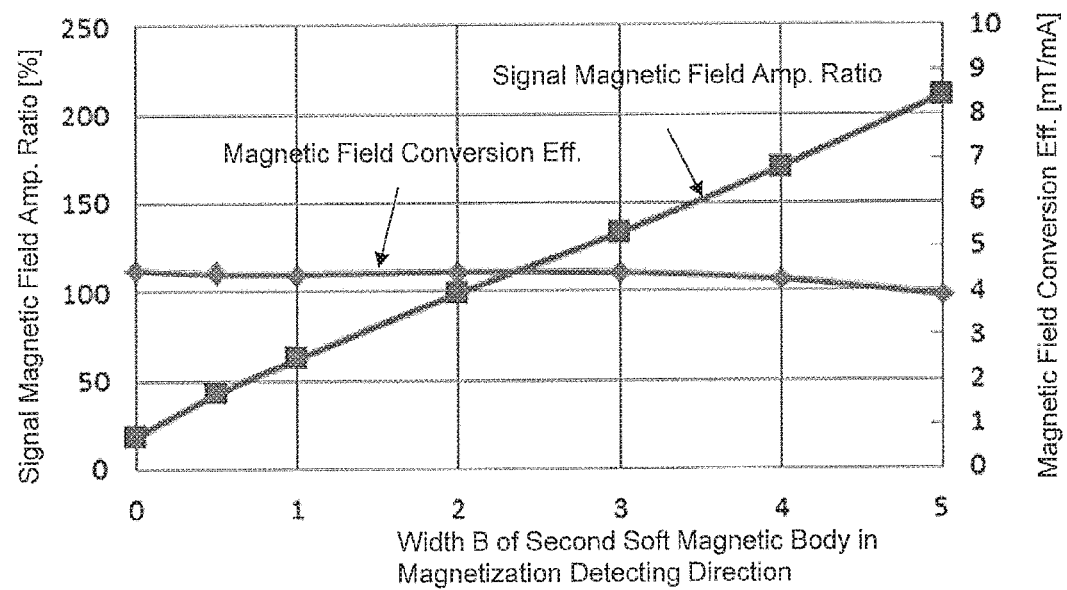
FIG. 9D is a graph showing a relationship among the widths of the second soft magnetic bodies in the magnetization detecting direction, a signal magnetic field amplification ratio and magnetic field conversion efficiency.

FIGS. 9A to 9C show some examples of widths B of second soft magnetic bodies 10a, 10b in the magnetization detecting direction (x-direction), and FIG. 9D shows a relationship between widths B of second soft magnetic bodies 10a, 10b and the signal magnetic field amplification ratio, as well as a relationship between widths B of second soft magnetic bodies 10a, 10b and the magnetic field conversion efficiency. In each of FIGS. 9A to 9C, second soft magnetic bodies 10a, 10b have the same widths. The magnetic field conversion efficiency is a ratio of cancelling magnetic field Bc to feedback current Fi, that is, an index indicating how large cancelling magnetic field Bc that is generated from a small feedback current Fi will be. The magnetic field conversion efficiency is substantially constant regardless of widths B of second soft magnetic bodies 10a, 10b, and is as large as about 4.0 mT/mA. On the other hand, the signal magnetic field amplification ratio increases as widths B of second soft magnetic bodies 10a, 10b become larger. In the examples of FIG. 9A to 9C, when widths B of second soft magnetic bodies 10a, 10b are 2 μm or larger, the amount of increase in signal magnetic field Bs due to second soft magnetic bodies 10a, 10b becomes larger than the amount of attenuation of signal magnetic field Bs due to first soft magnetic body 9, so that external magnetic field Bo that is generated by current line 6 is applied to magneto-resistive effect element 7 without being attenuated. Therefore, the amount of attenuation of external magnetic field Bo (the intensity of signal magnetic field Bs) can be adjusted by adjusting widths B of second soft magnetic bodies 10a, 10b in the magnetization detecting direction while keeping the magnetic field conversion efficiency substantially constant regardless of widths B of second soft magnetic bodies 10a, 10b.

Figure 10A:
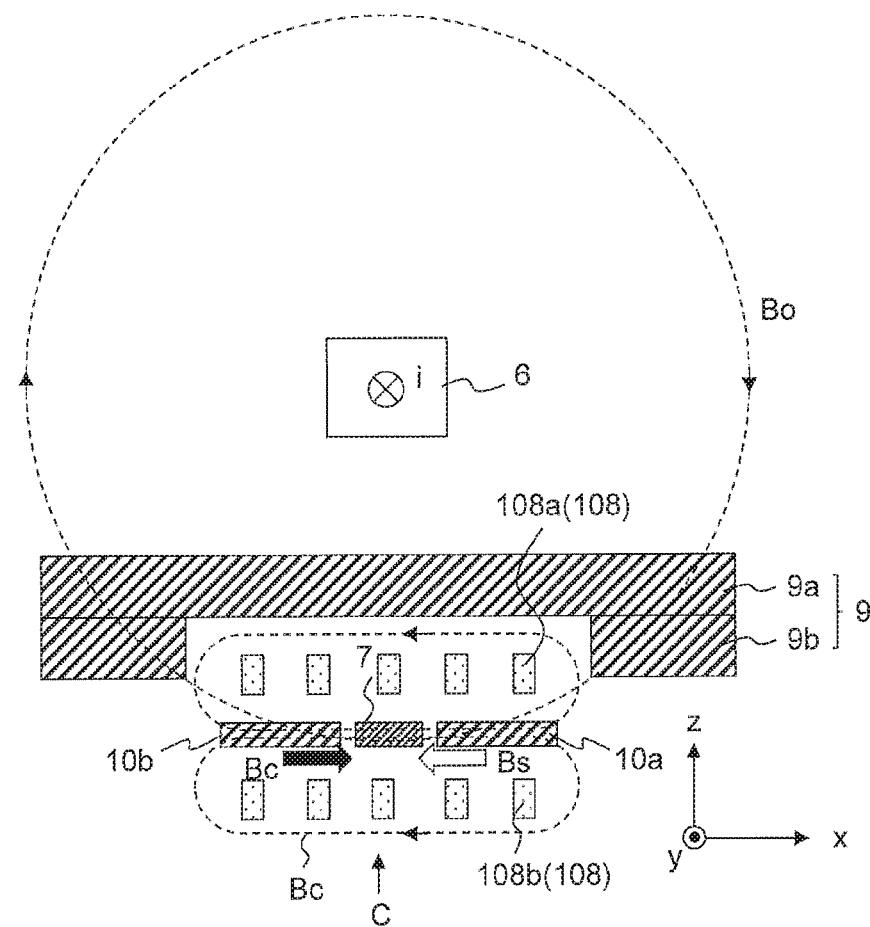
FIGS. 10A and 10B are views showing a schematic configuration of a current sensor according to a second embodiment.
Figure 10B:
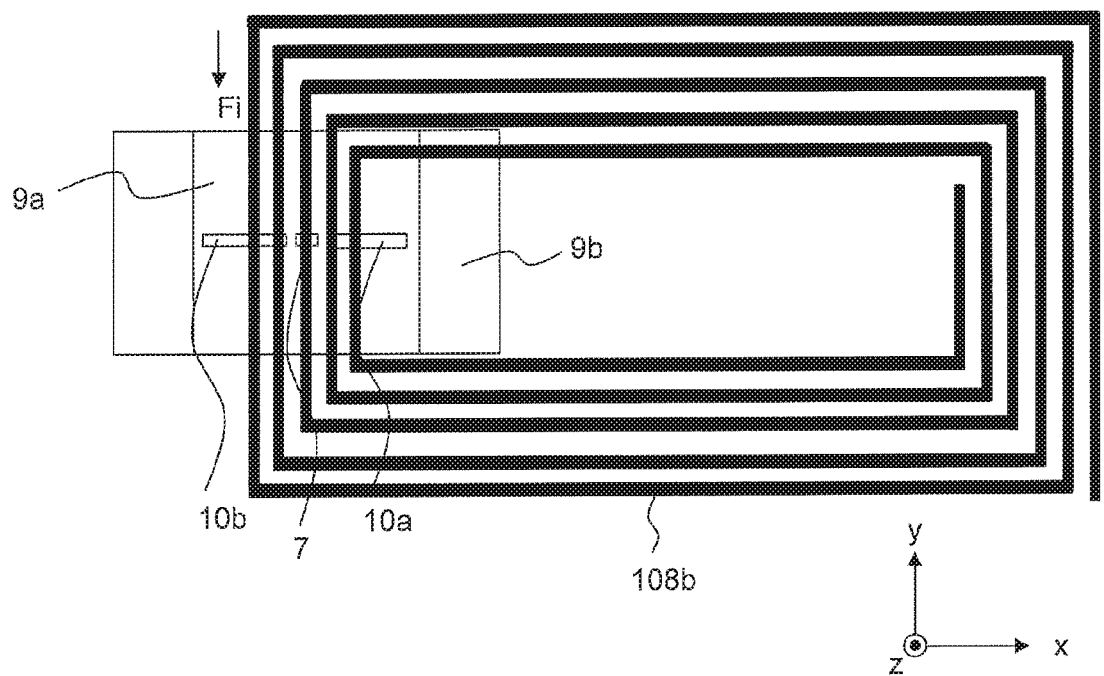

FIG. 10A is a view that is similar to FIG. 2A, showing another embodiment of the cancelling magnetic field generating means. FIG. 10B is a bottom view, seen upward in direction C in FIG. 10A. In the present embodiment, planar spiral feedback coils 108a, 108b that are wound on a planes that are parallel to substrate 11 are used as the cancelling magnetic field generating means. Feedback coil 108a is provided between magneto-resistive effect element 7 and first soft magnetic body 9, and feedback coil 108b is provided opposite to first soft magnetic body 9 with magneto-resistive effect element 7 interposed therebetween. Only one coil out of feedback coils 108a, 108b may be provided. Each of planar spiral feedback coils 108a, 108b has a plurality of linear portions, and adjacent linear portions are connected to each other substantially at right angles. One side of each turn of the coil is disposed near second soft magnetic bodies 10a, 10b in order to generate cancelling magnetic field Bc in the same manner as solenoid coil 8 described above.

Figure 11:
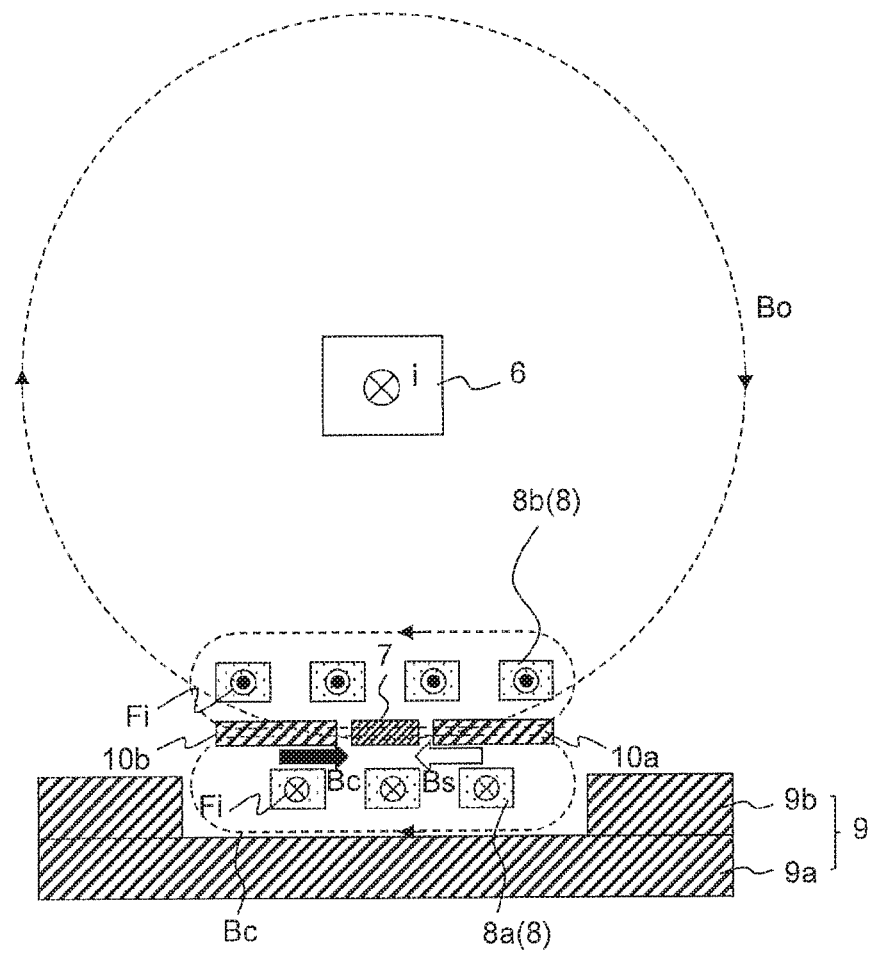
FIG. 11 is a view showing a schematic configuration of a current sensor according to a third embodiment.

FIG. 11 is a view that is similar to FIG. 2A, showing another embodiment of the present invention. In the present embodiment, first soft magnetic body 9 is located opposite to current line 6 with magneto-resistive effect element 7 interposed therebetween. First soft magnetic body 9 consists of first portion 9a and second portions 9b. Unlike the embodiments described above, second portions 9b are on the side of current line 6 seen from first portion 9a and extend in a direction away from substrate 11. External magnetic field Bo that is generated by current line 6 is absorbed by first soft magnetic body 9, and accordingly, signal magnetic field Bs that is applied to magneto-resistive effect element 7 is reduced. Therefore, first soft magnetic body 9 of the present embodiment has an effect similar to that of first soft magnetic body 9 of the embodiment described above.

LIST OF REFERENCE NUMERALS

1 Current sensor
6 Current line
7 Magneto-resistive effect element
71 Free layer
72 Spacer layer
73 Pinned layer
74 Antiferromagnetic layer
8, 108a, 108b Feedback coil (cancelling magnetic field generating means)
8a Lower portion
8b Upper portion
8c, 8d Lateral portion
9 First soft magnetic body 9a First portion
9b Second portion
10 Second soft magnetic body
12 Lower lead layer
13 Upper lead layer
Bc Cancelling magnetic field (Second magnetic field)
Bo External magnetic field
Bs Signal magnetic field (First magnetic field)
Fi Feedback current
i Current that flows in a current line

What is claimed is:

1. A current sensor, comprising:
a magneto-resistive effect element which is arranged near a current line, to which a signal magnetic field is applied, the signal magnetic field being induced by a current that flows in the current line, and the magneto-resistive effect element generates a magneto-resistive change in accordance with a change of the signal magnetic field;
cancelling magnetic field generating means that is provided near the magneto-resistive effect element and that generates a cancelling magnetic field that cancels the signal magnetic field;
a first soft magnetic body that is provided between the magneto-resistive effect element and the current line; and
a pair of second soft magnetic bodies that are provided on both sides of the magneto-resistive effect element with regard to a magnetization detecting direction of the magneto-resistive effect element, wherein
the current sensor further comprises a substrate where the magneto-resistive effect element, the cancelling magnetic field generating means, and the pair of second soft magnetic bodies are provided,
the substrate is spaced apart from the current line,
the first soft magnetic body has a first portion that extends parallel to the substrate and that shields the magneto-resistive effect element from the current line,
the first soft magnetic body has a second portion that extends toward the substrate from at least one edge of the first portion with regard to the magnetization detecting direction and
the current sensor further comprises a lead layer, which is connected to the magneto-resistive effect element and extends parallel to the substrate, and the second portion terminates between the first portion and the lead layer.

2. The current sensor according to claim 1, wherein the cancelling magnetic field generating means is a coil that is wound around the second soft magnetic bodies.

3. The current sensor according to claim 1, wherein the cancelling magnetic field generating means is at least one coil that is wound on a plane that is parallel to the substrate, wherein the cancelling magnetic field generating means is located between the magneto-resistive effect element and the first soft magnetic body and/or opposite to the first soft magnetic body with the magneto-resistive effect element interposed therebetween.

4. The current sensor according to claim 1, wherein a distance between the cancelling magnetic field generating means and the first soft magnetic body is equal to or more than 0.1 µm and equal to or less than 30 µm, and a distance between the cancelling magnetic field generating means and the second soft magnetic body is equal to or more than 0.1 µm and equal to or less than 10 µm.

5. The current sensor according to claim 1, wherein the magneto-resistive effect element is a tunneling magneto-resistive effect element.

6. The current sensor according to claim 5, wherein a length of the tunneling magneto-resistive effect element in the magnetization detecting direction is equal to or more than 0.1 µm and equal to or less than 10 µm, and a length of the tunneling magneto-resistive effect element in a direction that is parallel to the current line is twice as large as the length of the tunneling magneto-resistive effect element in the magnetization detecting direction or more.

7. A current sensor, comprising:
a magneto-resistive effect element which is arranged near a current line, to which a signal magnetic field is applied, the signal magnetic field being induced by a current that flows in the current line, and the magneto-resistive effect element generates a magneto-resistive change in accordance with a change of the signal magnetic field;
cancelling magnetic field generating means that is provided near the magneto-resistive effect element and that generates a cancelling magnetic field that cancels the signal magnetic field;
a first soft magnetic body that is opposite to the current line with the magneto-resistive effect element interposed therebetween; and
a pair of second soft magnetic bodies that are provided on both sides of the magneto-resistive effect element with regard to a magnetization detecting direction of the magneto-resistive effect element, wherein
the current sensor further comprises a substrate where the magneto-resistive effect element, the cancelling magnetic field generating means, and the pair of second soft magnetic bodies are provided,
the substrate is spaced apart from the current line,
the first soft magnetic body has a first portion that extends parallel to the substrate and that shields the magneto-resistive effect element from the current line, and
the first soft magnetic body has a second portion that extends toward the substrate from at least one edge of the first portion with regard to the magnetization detecting direction and
the current sensor further comprises a lead layer, which is connected to the magneto-resistive effect element and extends parallel to the substrate, and the second portion terminates between the first portion and the lead layer.

8. A current sensor, comprising:
a magneto-resistive effect element which is arranged near a current line, to which a signal magnetic field is applied, the signal magnetic field being induced by a current that flows in the current line, and the magneto-resistive effect element generates a magneto-resistive change in accordance with a change of the signal magnetic field;
cancelling magnetic field generating means that is provided near the magneto-resistive effect element and that generates a cancelling magnetic field that cancels the signal magnetic field;
first magnetic field intensity adjusting means that attenuates the signal magnetic field that is applied to the magneto-resistive effect element and that increases the cancelling magnetic field that is applied to the magneto-resistive effect element; and
second magnetic field intensity adjusting means that increases both the signal magnetic field and the cancelling magnetic field that are applied to the magneto-resistive effect element, wherein
the current sensor further comprises a substrate where the magneto-resistive effect element, the cancelling magnetic field generating means, and the pair of second soft magnetic bodies are provided, the substrate is spaced apart from the current line, the first magnetic field intensity adjusting means has a first portion that extends parallel to the substrate and that shields the magneto-resistive effect element from the current line, the first magnetic field intensity adjusting means has a second portion that extends toward the substrate from at least one edge of the first portion with regard to the magnetization detecting direction and the current sensor further comprises a lead layer, which is connected to the magneto-resistive effect element and extends parallel to the substrate, and the second portion terminates between the first portion and the lead layer.

9. The current sensor according to claim 8, wherein an amount of the signal magnetic field that is increased by the second magnetic field intensity adjusting means is larger than an amount of the signal magnetic field that is attenuated by the first magnetic field intensity adjusting means.

* * * * *